United States Patent
Lojek

(10) Patent No.: US 6,933,557 B2
(45) Date of Patent: Aug. 23, 2005

(54) FOWLER-NORDHEIM BLOCK ALTERABLE EEPROM MEMORY CELL

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/639,073

(22) Filed: Aug. 11, 2003

(65) Prior Publication Data

US 2005/0037571 A1 Feb. 17, 2005

(51) Int. Cl.[7] .............................................. H01L 29/788
(52) U.S. Cl. .................. 257/315; 257/316; 257/318; 257/321; 365/185.01
(58) Field of Search ................................ 257/239, 261, 257/298, 315–326; 438/201, 211, 216, 241, 257, 258, 260–266, 591, 593

(56) References Cited

U.S. PATENT DOCUMENTS

| | | | |
|---|---|---|---|
| 4,783,766 A | 11/1988 | Samachisa et al. | 365/185 |
| 4,853,895 A | 8/1989 | Mitchell et al. | 365/185 |
| 4,949,309 A | 8/1990 | Rao | 365/218 |
| 5,066,992 A | 11/1991 | Wu et al. | 357/23.5 |
| 5,225,700 A | 7/1993 | Smayling | 257/321 |
| 5,329,487 A | 7/1994 | Gupta et al. | 365/185 |
| 5,355,347 A | 10/1994 | Cioaca | 365/230.08 |
| 5,397,726 A | 3/1995 | Bergemont | 437/43 |
| 5,523,980 A | 6/1996 | Sakui et al. | 365/230.08 |
| 5,793,079 A * | 8/1998 | Georgescu et al. | 257/316 |
| 5,811,852 A * | 9/1998 | Ling | 257/315 |
| 6,160,287 A | 12/2000 | Chang | 257/321 |
| 6,236,594 B1 | 5/2001 | Kwon | 365/185.11 |
| 6,420,753 B1 * | 7/2002 | Hoang | 257/321 |
| 6,468,863 B2 | 10/2002 | Hsieh et al. | 438/261 |
| 6,486,032 B1 | 11/2002 | Lin et al. | 438/266 |
| 6,522,580 B2 * | 2/2003 | Chen et al. | 365/185.02 |
| 6,563,733 B2 | 5/2003 | Chang et al. | 365/185.1 |
| 6,567,313 B2 * | 5/2003 | Tanaka et al. | 365/185.28 |
| 6,597,047 B2 | 7/2003 | Arai et al. | 257/411 |
| 2002/0135013 A1 | 9/2002 | Chiu | 257/316 |

* cited by examiner

Primary Examiner—Andy Huynh
(74) Attorney, Agent, or Firm—Schneck & Schneck; Thomas Schneck

(57) ABSTRACT

A block alterable memory cell has a select control gate extending from a floating gate region to a drain region. The block alterable memory cell comprises a substrate layer that further includes a source implant region, an active region, a floating gate transistor region, and a drain implant region. A tunnel oxide layer overlies the substrate layer and is deposited to a thickness of approximately 70 angstroms. The select control gate comprises a first oxide layer overlying the tunnel oxide layer, an inter poly layer overlying over the first oxide layer, and a second layer extending over the floating gate transistor region and the active region to an edge of the drain implant region.

17 Claims, 7 Drawing Sheets

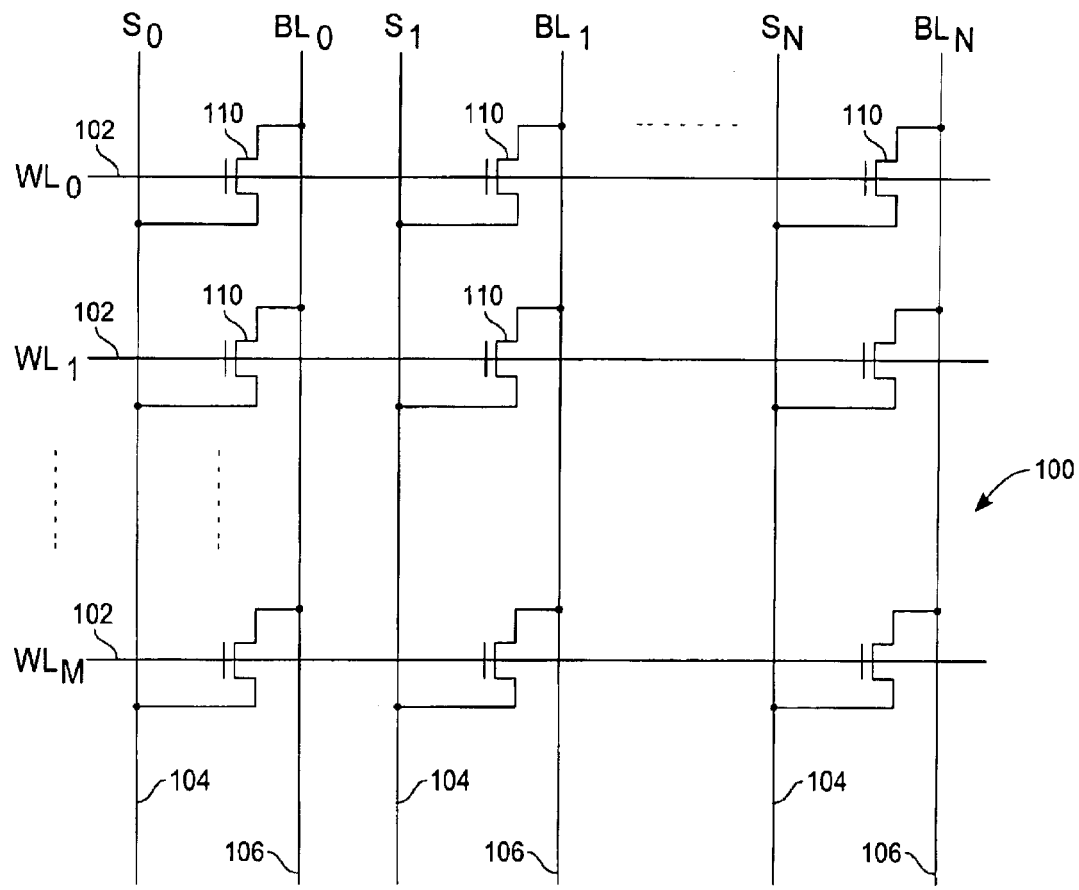
Fig. 1 (PRIOR ART)
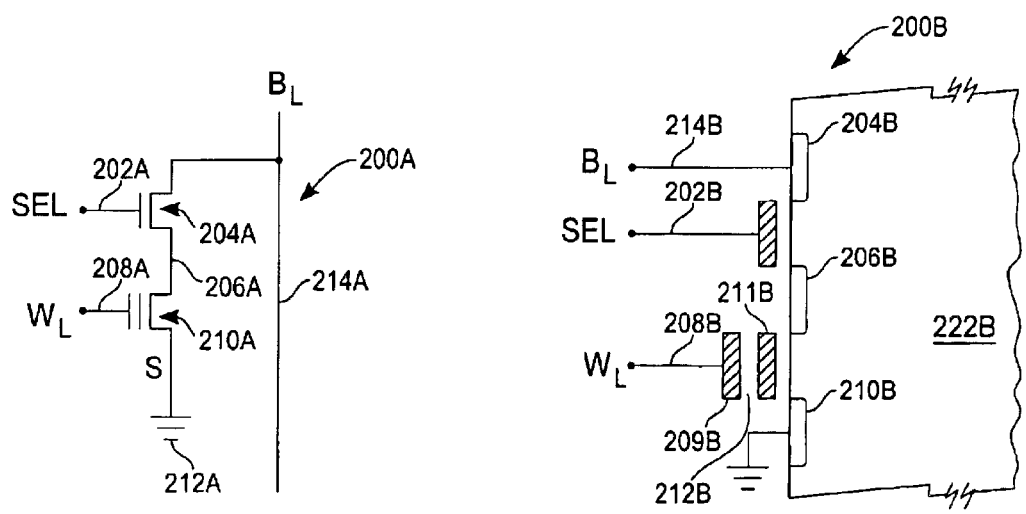
Fig. 2A (PRIOR ART)   Fig. 2B (PRIOR ART)

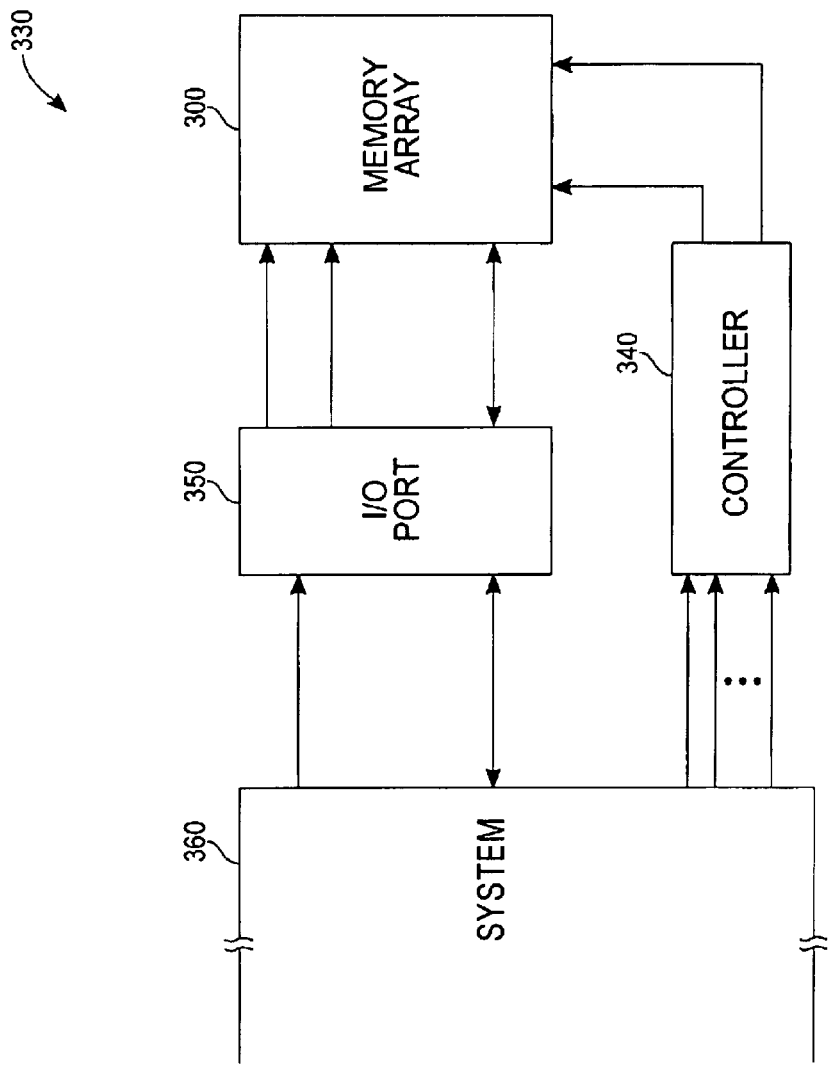
Fig._3B

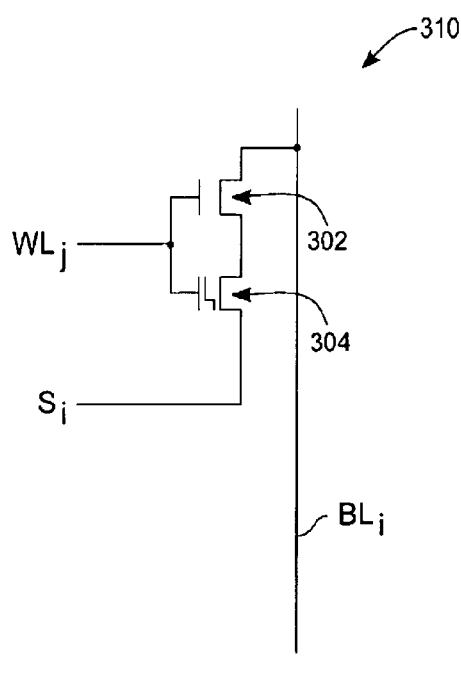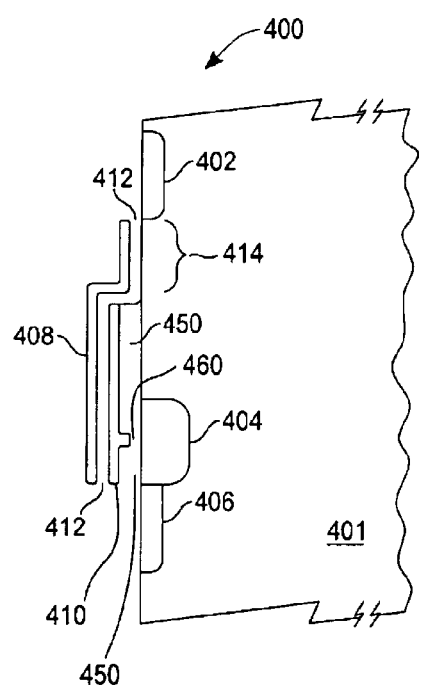
Fig._4A  Fig._4B

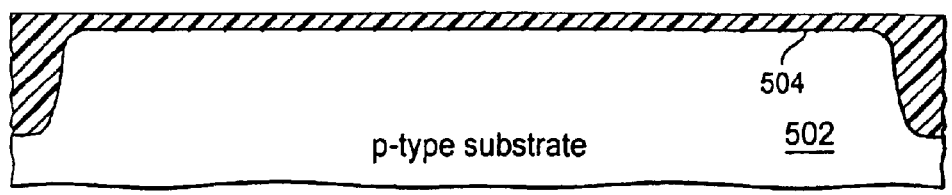
Fig._5A
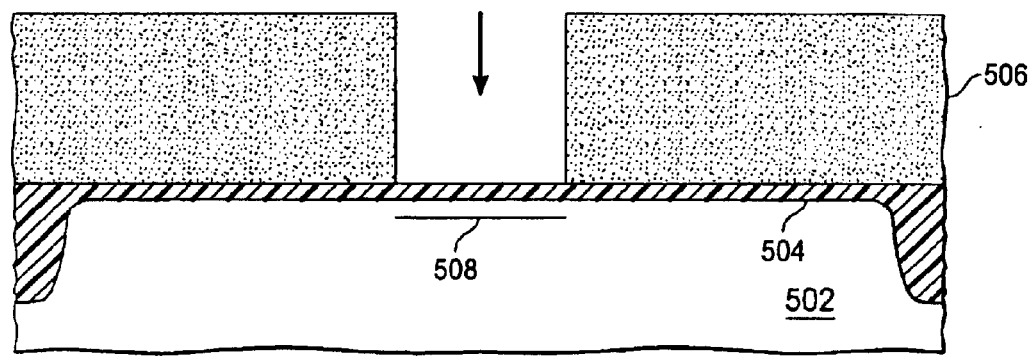
Fig._5B
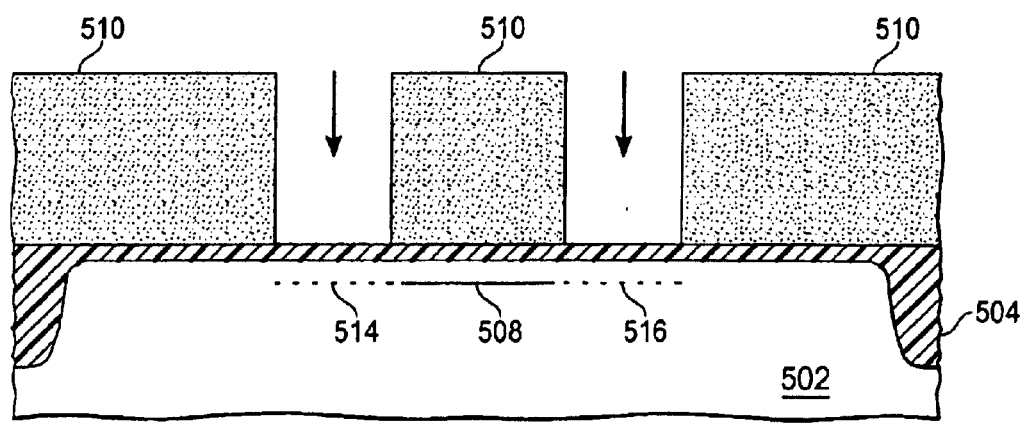
Fig._5C

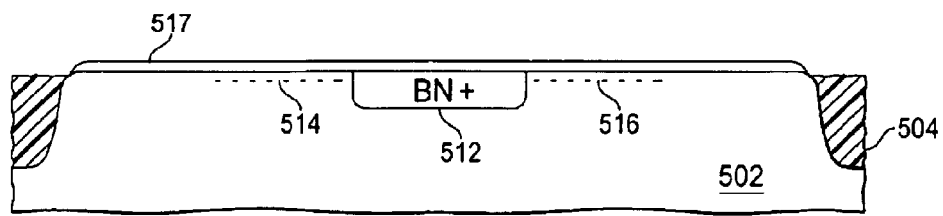
Fig. _5D
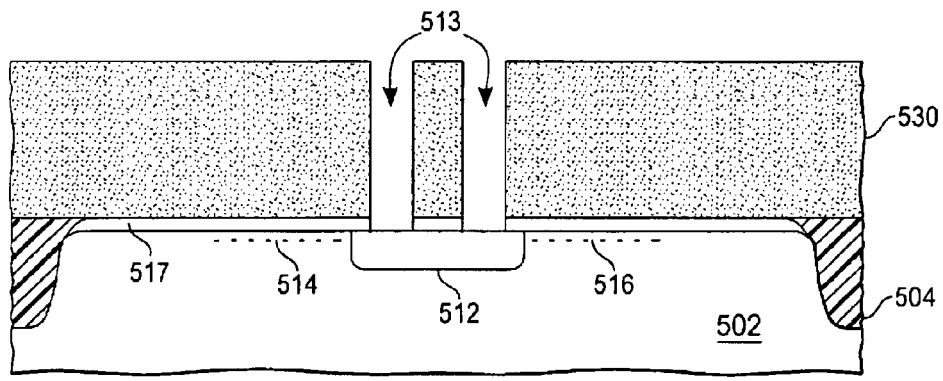
Fig. _5E
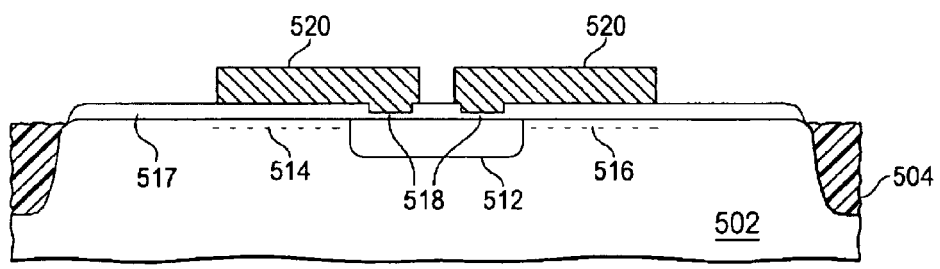
Fig. _5F
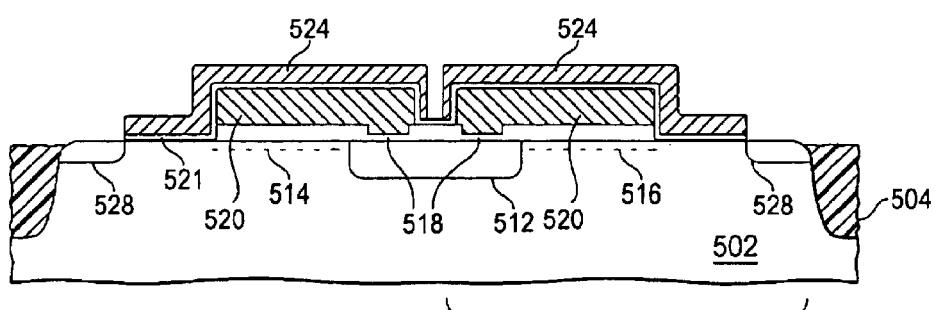
Fig. _5G

FOWLER-NORDHEIM BLOCK ALTERABLE EEPROM MEMORY CELL

CROSS REFERENCE TO RELATED APPLICATIONS

This application is related to co-pending application Ser. No. 10/883,159 which is a CIP of application Ser. No. 10/423,637 having a divisional application Ser. No. 10/995,453 and also another CIP application Ser. No. 10/465,718.

TECHNICAL FIELD

The present invention relates in general to semiconductor devices. More specifically, the present invention relates to block alterable memory devices.

BACKGROUND ART

The need for a high-density block alterable memory devices is ever increasing. Cellular phones, memory sticks, digital cameras, laptop computers, and personal data assistants are a few examples of small devices that demand higher density memories. These devices require alterable memories because their contents change every time they are in use. For example, the size of a memory stick is as small as a pen but it can store 256 MB memory. The memory stick has a Universal Standard Bus (USB) port that can plug into another USB memory port of a computer to transfer the data from the hard drive of that computer. Therefore, the memory stick and other similar devices such as camera memories need a high-density alterable memory device to erase old data and store new data. The Electrically erasable programmable read only memory (EEPROM) common in the industry cannot be used in these applications because EEPROM is not alterable under normal operation conditions.

A typical block alterable memory device employs flash memory to program, read, or erase memory cells. With reference to FIG. 1, a flash memory 100 is a memory array which is arranged in rows 102 and columns 106. Each row 102 has N+1 memory cells connecting to source lines $S_0$–$S_N$. The first memory cell in the row 102 belongs to column $BL_0$ and the $N^{th}$ memory cell belongs column $BL_N$. Therefore, there are N+1 columns in the flash memory array 100. The gates of all the cells within a column 106 are coupled together to form a wordline $WL_i$ 102. There are M+1 wordlines or rows in the flash memory array 100, ranging from $WL_0$ to $WL_M$. The sources of the cells in each column are coupled together and coupled to the select lines 104, ranging from $S_0$ to $S_N$. The drains of the cells in each row are coupled together to form a bitline 106, ranging from $BL_0$ to $BL_N$. The flash array 100 enables users to electrically program and erase information stored in a memory cell 110.

Each memory cell 110 in the flash memory matrix 100 is a floating gate transistor. The structure of a floating gate transistor is similar to a traditional MOS device, except that an extra polysilicon strip is inserted between the gate and the channel. This strip is not connected to anything and called a floating gate. The threshold voltage of a floating gate transistor is programmable. The described flash memory 100 uses the Fowler-Nordheim tunneling effect to program a cell 110. Programming is a process wherein electrons are placed in the floating gate. Programming occurs when applying a high voltage between the gate and source, and gate and drain terminals that a high electric field causes injection of carriers into the floating gate. Electrons acquire sufficient energy to become hot and traverse the first oxide insulator, so they get trapped on the floating gate. Programming is done on a bit basis by applying a correct voltage at the bitline 106 of each cell 110.

The floating gate layer allows the cell 110 to be electrically erased through the gate. Erase and program operations of the memory array 100 can be done on more than one cell at a time. However, the alterable flash memory device has reliability and durability problems because the voltages for erasing and programming are very high.

With reference to Table 1 at the end of this specification, in order to achieve block alterable memory, the memory cell 110 in the flash memory array 100 as shown in FIG. 1 needs to apply +10 volts or –10 volts across the wordline $WL_i$ 102, the source line $S_i$ 104, and the bitline $BL_i$ 106. Accordingly, the placement of such high voltages to a single memory cell transistor 110 presents reliability and durability problems. Over long periods of time, placing high voltages on the memory device 100 may alter a program stored in each cell 110.

One prior art solution to this problem (for example, U.S. Pat. No. 5,066,992 to T. C. Wu) is shown in FIG. 2A. This solution places an extra select transistor 202A in series with a flash memory cell 210A. The gate of the additional select transistor 202A is coupled to the select line $S_0$ to $S_N$, the drain 204A is coupled to the bitline $BL_0$ to $BL_N$ 214A, and the source 206A is coupled to the drain of the flash cell. Thus, when a select line $S_i$ is ON, each selected transistor connected to the select line $S_i$ is turned ON. As a result, the voltage of the drain of the flash cell 210A is proportional to the voltage of the bitline $B_i$. During a reading cycle, the bitline 214A is open, the select line $S_i$ is grounded, and the wordline $WL_i$ is at negative program voltage $V_D$. Thus, a program stored in an EEPROM device 200A remains unaltered. Thus, the memory array 100 lasts longer and avoids the reliability and durability of one-transistor memory cells presented above. However, the two-transistor memory cells require larger areas for manufacturing because each memory cell has two transistors.

Referring to FIG. 2B, various cross-sectional views of a memory array 200B are shown. Memory array 200B is formed on a face of a semiconductor substrate 222B. Substrate 222B is doped with a p-type majority carrier. Bitline BL 214B, select line SEL 202B, wordline WL 208B, and the source are n-type and implanted within substrate 222B at the surface. The gate 208B comprises a first poly layer 209B, a second poly layer 211B, and an inter poly layer 212B. Accordingly, column lines 214B and 206B serves as a source and drain of transistors which are used in forming memory cells contained within memory array 200B. Each of the column lines 214B serves as a source of one memory cell or a drain of an adjacent cell. However, this solution dedicates large sections on the semiconductor substrate to the alterable block function. An undesirably low density flash memory results. Consequently, the industry has a need for a memory device structure which has block alterable capability without dedicating semiconductor substrate area to that function.

U.S. Pat. No. 4,783,766 to Samachisa et al. describes a memory cell of a block alterable EEPROM in which a single control gate is common to both the floating gate memory cell and the select transistor device. However, the device is formed using a different process flow from that of flash memory devices, thus requiring a separate masking sequence.

U.S. Pat. No. 6,420,753 to Hoang describes a similar structure to that of the Samachisa patent. It is stated that these memory cells can be manufactured without requiring additional processing steps from those of comparable flash memories.

SUMMARY OF THE INVENTION

A Fowler-Nordheim block alterable memory cell in accordance with the present invention is carried out in one form by a memory cell constructed from two separate transistor cells that have common select-control gate. The two cells are constructed on a substrate or in a well that exhibits a first (e.g., "p" or acceptor) conductivity type. A tunnel oxide layer resides on the substrate face. The select-control gate comprises a first poly layer, an interpoly layer, and a second poly layer. The second poly layer is extended to connect to the gate of the first cell to form a common select-control layer. The extended portion of the common select-control layer contacts a drain implant region. A buried n+ implant region is formed near the surface of the p-substrate. The floating gate region is positioned above the buried implant and extends over the channel of transistor 400B. A self-aligned source/drain implant is located at edges of the control poly. The area of the substrate between the floating gate region and the drain implant region that lies underneath the extended portion of the common select-control layer is known as the active region. Thus, the Fowler-Nordheim block alterable memory device in accordance with the present invention is constructed as a single transistor memory cell but it behaves as a two transistor cell because of the extended select-control layer.

The present invention is also a method to fabricate a memory cell to achieve a Fowler-Nordheim block alterable memory cell as described above. The method first deposits a screen oxide of about 150 angstroms thickness over the p-type substrate. Then a photoresist mask with an opening is added on top of the screen oxide layer. A cell channel and buried n$^+$ implants are implanted at the location of the opening of the mask and near the surface of the p-substrate. Next, the screen oxide is etched and initial gate oxides are grown. A tunnel window mask is then formed. A tunnel oxide is etched in the screen oxide layer where the windows of the tunnel window mask are located. The first polycrystalline silicon (poly) layer over the tunnel oxide and cell implants are deposited. An insulating layer is formed overlying the first poly layer. An extended final (second) poly layer is deposited over the insulating layer. Finally the device is completed by source and drain implants.

BRIEF DESCRIPTION OF THE DRAWINGS

FIG. 1 illustrates a schematic diagram of a prior art memory array having single flash memory cells.

FIG. 2A illustrates a schematic diagram of a prior art dual transistor memory cell that has block alterable capability. The top cell is used to define the block to be altered, and the second cell or flash cell is used to store data information.

FIG. 2B illustrates a sectional view of the dual transistor memory cell of FIG. 2A.

FIG. 4A illustrates a schematic diagram of a single cell from the Fowler-Nordheim alterable block memory array in accordance with the present invention.

FIG. 4B illustrates a cross sectional view of a Fowler-Nordheim block alterable memory cell as illustrated in FIG. 4A.

FIGS. 5A–5G illustrate exemplary cross sectional views of process steps in accordance with the present invention.

FIG. 5A illustrates a cross sectional view of a substrate with a screen oxide layer.

FIG. 5B illustrates a cross sectional view of a barrier mask layer with a window for depositing a cell implant in the substrate.

FIG. 5C illustrates a cross sectional view of a mask-out implant.

FIG. 5D illustrates a cross sectional view of a p-substrate with a buried n+implant, a source implant, and a drain implant.

FIG. 5E illustrates a cross sectional view of a Fowler-Nordheim cell with a window tunnel mask and etch oxide.

FIG. 5F illustrates a cross sectional view of a Fowler-Nordheim block alterable memory cell with a tunnel oxide layer and a first polycrystalline layer.

FIG. 5G illustrates cross sectional view of a Fowler-Nordheim block alterable cell with an oxide-nitride-oxide (ONO) deposition and a control poly layer deposition.

BEST MODE FOR CARRYING OUT THE INVENTION

Figure 3A:
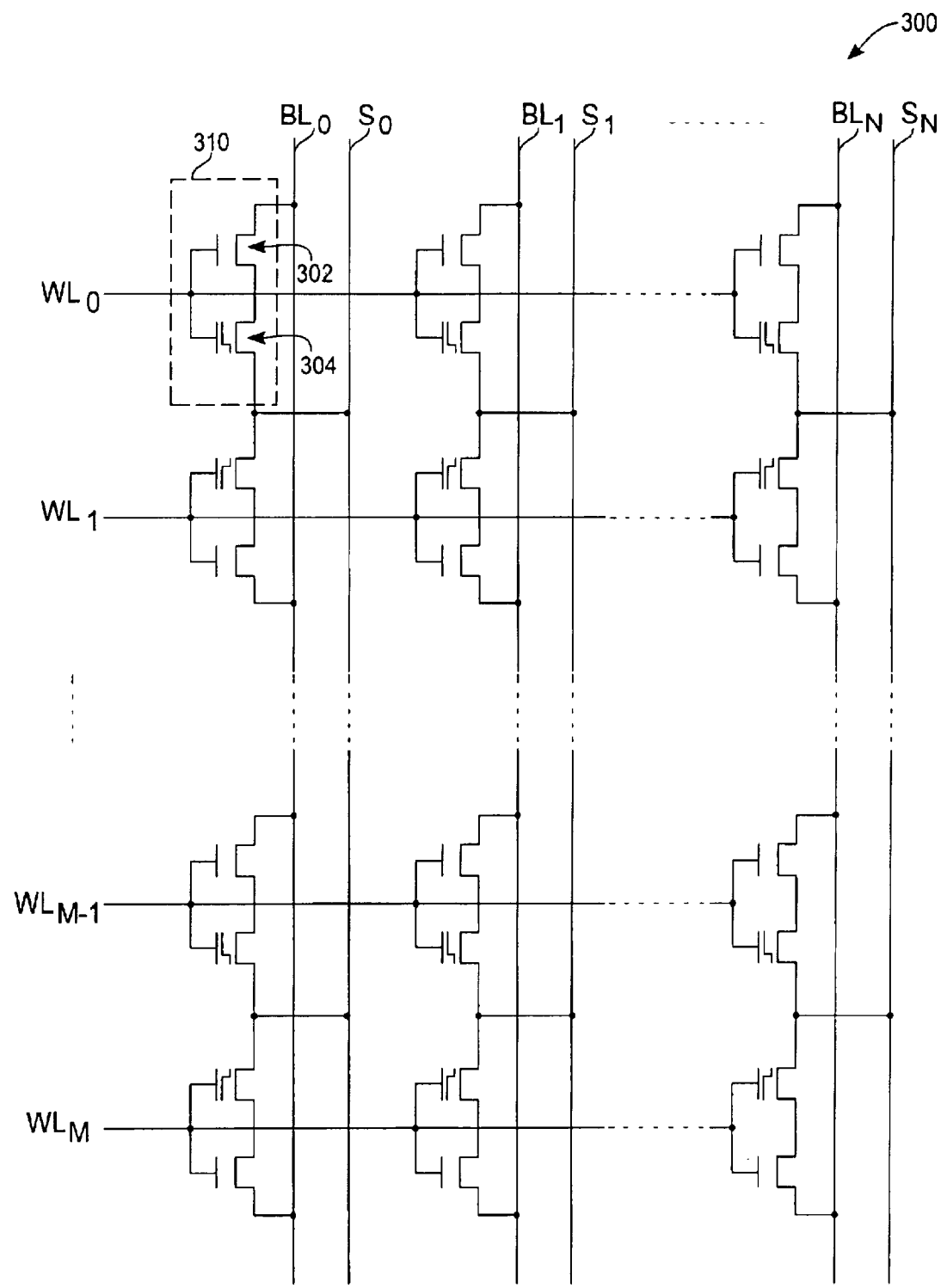
FIG. 3 illustrates a schematic diagram of a Fowler-Nordheim alterable block memory array in accordance with the present invention.

FIGS. 3, 4A, and 4B show various views of an exemplary embodiment of a Fowler-Nordheim block alterable memory architecture fabricated according to a method of the present invention. With respect to FIG. 3, a memory array 300 includes a plurality of memory cells 310. The memory cell 310 includes a select transistor 302 and a memory transistor 304 which share a common control gate. The plurality of memory cells 310 may be erased and programmed in blocks or programmed or read bit-by-bit by applying appropriate voltages to the bitlines ($BL_0$ to $BL_N$), source lines ($S_0$ to $S_N$) and wordlines ($WL_0$ to $WL_M$) Typically all memory cells 310 in the array 300 are normally constructed as a result of similar process steps, and therefore, all cells are similar in structure.

Referring to FIG. 4A, a schematic of a memory cell 310 in accordance with the present invention includes a memory transistor 304 connected in series with a select transistor 302 at a drain/source junction. (The drain of the memory transistor 304 is coupled to the source of the select transistor 302.) The source of the memory transistor 304 is coupled to a select line $S_j$. The drain of the select transistor 302 is coupled to a bitline $BL_i$. A common gate of the memory transistor 304 and select transistor 302 is coupled to a wordline $WL_j$. This common gate for the memory 304 and select 302 transistors can be manufactured as a single cell having an extended and continuous poly layer, thus reducing an area of the memory cell 310.

With reference to FIG. 4B, a cross sectional view 400 of the memory cell 310 is illustrated. The memory cell 400 is formed on a semiconductor substrate (or well) 401 of a first conductivity type, which in the exemplary embodiment is p-type. A drain implant region 402 and a source implant region 406, are implanted within an uppermost surface of the substrate 401. A buried, heavily doped implant 404 for the floating gate region is also formed within an uppermost surface of the substrate 401. The implant regions 402, 404, and 406 are of a second conductivity type of a polarity opposite that of the conductivity type of the substrate 401. In a specific exemplary embodiment, the implants are n-type. The buried implant 404 is of n+ conductivity and serves as a tunneling charge source for a floating gate of the memory transistor 400. The drain implant region 402 and the buried implant 404 are spaced apart, so as to define an active region 414 therebetween. Accordingly, the drain implant region 402 connects to the bitline $BL_i$. The source implant region 406 connects to the source line $S_i$.

A first poly layer 410, forming the floating gate of the memory transistor 304, overlays the buried implant region 404, separated therefrom by a gate ONO layer 450. A second poly layer 408, forming a common control gate, extends continuously over the first poly layer 410 (which forms the floating gate) from the source dopant region 406 to the drain dopant region 402, overlaying both the buried implant 404 and the select transistor 302 active region 414. A tunnel oxide 460 of thickness 50–70 angstroms is formed in a tunnel window region between the buried implant 404 and the floating gate 410B.

Figure 6:
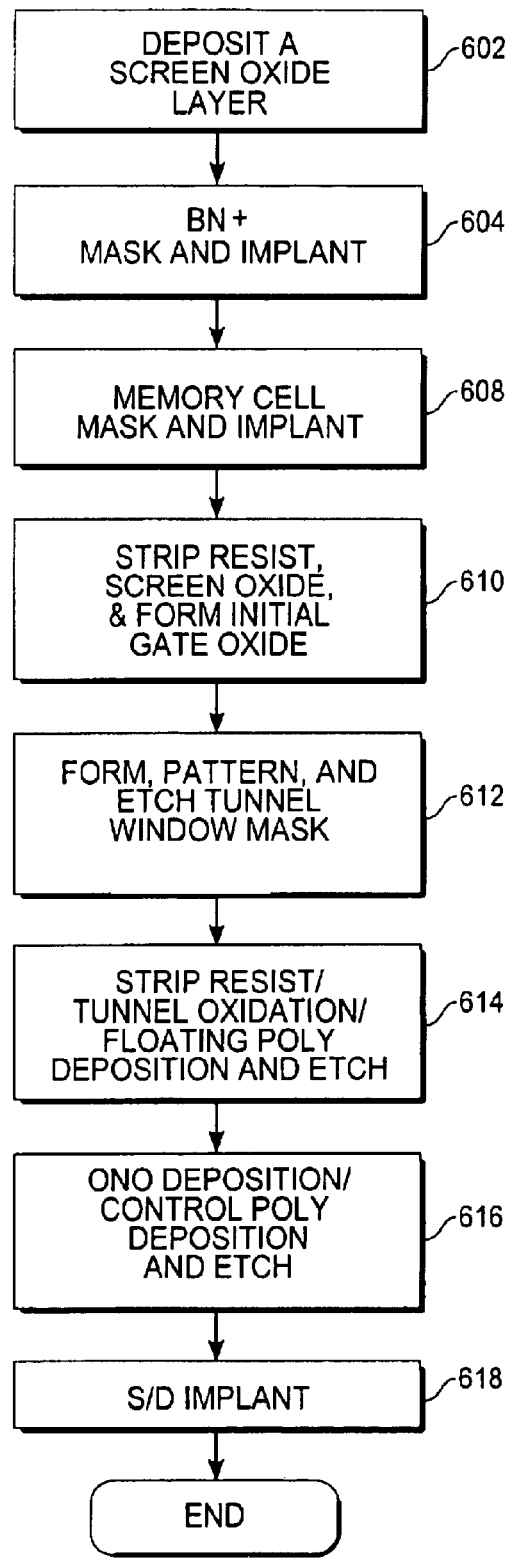
FIG. 6 illustrates a flowchart of a method for manufacturing the Fowler-Nordheim block alterable cell corresponding to FIGS. 5A–5G.

An exemplary manufacturing process of the memory cell 310 is shown in the flowchart of FIG. 6 and a result after each step is shown in FIGS. 5A–5G. With reference to FIG. 5A, according to a preferred process of manufacturing the present invention, at step 602, a screen oxide 504 is deposited over a substrate 502. The thickness of the screen oxide layer is approximately 150 angstroms.

Referring to FIGS. 5B and 6, at step 604, a photoresist mask 506 is applied at face 504 of substrate 502. This mask 506 is patterned so as to permit ion implantation of a floating gate region though gaps in the photoresist mask 506. A buried N+ tunnel region 508 is implanted in semiconductor substrate 502 through the opening of the mask 506 and the mask 506 is then removed using a conventional process. The substrate 502 is then annealed in, for example, a 900° C. nitrogen environment to ameliorate damage caused to substrate 502 by the prior implantation step 604 and to diffuse the tunnel implant region 508 into substrate 502.

Referring to FIGS. 5C and 6, at step 608, after the annealing treatment of the substrate 502, another mask 510 is formed on top of the oxide layer 504 for memory cell implantation. Resulting cell implant regions 514 and 516 and buried implant region 512 are seen in FIG. 5D.

Referring to FIGS. 5D and 6, at step 610, the screen oxide is etched away and an initial gate oxide layer 517 is formed in its place.

Referring to FIGS. 5E and 6, at step 612, a tunnel window mask 530 is deposited to a very high thickness so that an opening for a tunnel oxide layer 513 can be precisely positioned at the openings of this tunnel window mask 530 layer above the buried implant 512.

With reference to FIGS. 5F and 6, at step 614, after etching away the gate oxide layer 517 in the tunnel windows, a thin tunnel oxide layer 518 is deposited to a thickness of about 50–70 angstroms. In a preferred embodiment the tunnel oxide layer 518 represents a thin, high quality silicon dioxide layer which may either be grown in a dry $O_2$ and HCl mixture atmosphere at a temperature of around 800° to 850° C. Once the tunnel oxide 518 has been formed, polysilicon floating gates 520 are formed over the gate 517 and tunnel oxide 518 layers.

Referring to FIGS. 5G and 6, at step 616, an oxide or oxide nitride oxide (ONO) interpoly dielectric 521 is deposited and an etch is performed to create interpoly insulation.

Next, a control gate poly layer (not shown) is applied using an LPCVD process. The deposition of the poly layer is a low temperature application, preferably at less than 625° C., which tends to maintain the poly layer in an amorphous state.

The poly layer is patterned and etched to produce strips of materials which form control gates 524. The control gate 524 polysilicon extends beyond the area above the floating gate 520 to adjacent areas to form a common select gate. In addition, this pattern and etch step removes material from the poly layer thereby forming the remaining two sides for each of floating gates 520.

Finally, finishing step 618 is shown in FIG. 6, such as adding select transistor drain implants 528 and a nitride overcoat may be performed to complete the process. Using the control gate 524 poly layer as a mask, source implants 528 for the select transistor are made just past the outer edge of the control gate 524 poly.

A memory device constructed according to the teaching of the present invention may be block erased and programmed, and also bit programmed. Referring to Table 1 and FIG. 3, in block programming, memory cell transistor sources, $S_0$ to $S_N$, in a block, and also the select transistor drains (the bitlines $BL_0$ to $BL_N$) are held at a large negative potential, such as −10 volts, while the memory cell transistor control gates in the block (the wordlines $WL_0$ to $WL_N$) are raised to a relatively high positive voltage, such as 10 volts. This causes tunneling of electrons from the buried implant through the tunnel oxide into the floating gates.

Memory cells may be block erased by leaving sources $S_0$ to $S_N$ in the block open, and reversing the word and bitline voltages from the block programming case. Placing bitline electrodes in the block at a relatively high positive voltage, such as 10 volts, and the wordline electrodes in the block at negative 10 volts, causes electrons be expelled out of the floating gate region back into the buried implant.

Bit programming involves applying a large positive potential to the wordlines and to all bitlines except a selected bitline $BL_{i+1}$, which is at ground potential. The source lines $S_0$ to $S_N$ are left open.

Memory cells in the present invention may be read by placing the control gate $WL_{i+1}$ of a particular cell $(_{i+1})$ to be read at positive $V_D$, and at the same time, placing the drain (bitline) of the particular cell to be read at a relatively low (about 1 volt) voltage $V_s$. All source lines $S_0$ to $S_N$ are grounded in read mode. Cells not in the selected word (row) and bit column have negative $V_D$ voltages applied to their wordlines and bitlines that are open.

TABLE 1

Voltages Required for Block Programming/Erasing in a Block Alterable Memory.

|  | $WL_i$ | $WL_{i+1}$ | $S_i$ | $BL_i$ | $S_{i+1}$ | $BL_{i+1}$ | $S_{i+2}$ | $BL_{i+2}$ |
|---|---|---|---|---|---|---|---|---|
| Block programming | +10 V | +10 V | −10 V | −10 V | −10 V | −10 V | −10 V | −10 V |
| Block Erase | −10 V | −10 V | Open | +10 V | Open | +10 V | Open | +10 V |
| Bit (i + 1) program | +10 V | +10 V | Open | +10 V | Open | 0V | Open | +10 V |
| Read (I + 1) | −VD | VD | GND | Open | GND | Vs~1 V | GND | Open |

What is claimed is:

1. A block alterable memory cell, comprising:
   a substrate layer including an active region having a source implant region, a buried implant region essentially contiguous with said source implant region, a tunnel window region overlaying said buried implant region, and a drain implant region spaced apart from the buried implant, all in the active region;
   a tunnel oxide layer overlaying the tunnel window and a portion of said buried implant region;
   a floating gate oxide layer overlaying said tunnel window region;
   a floating gate layer overlaying said tunnel oxide layer and said floating gate oxide layer;
   an interpoly layer having a first region overlaying said floating gate layer, said interpoly layer having a second region extending continuously from the first region and overlaying an edge of said source implant region to an edge of said drain implant region; and
   a control gate layer extending continuously over said interpoly layer, said control gate layer extending from an edge of said source implant region to an edge of said drain implant region,
   whereby the control gate controls a first transistor having said floating gate and simultaneously controls a second adjacent select transistor having said source and drain.

2. The block alterable memory cell of claim 1, wherein said substrate layer is a p-type doped substrate.

3. The block alterable memory cell of claim 1, wherein said source implant region, said drain implant region, and said buried implant region are n-type implants.

4. The block alterable memory cell of claim 1, wherein said floating gate layer and said control gate layer are polysilicon.

5. The block alterable memory cell of claim 1, wherein said interpoly layer is a nitride layer.

6. The block alterable memory cell of claim 1, wherein said interpoly layer is an ONO layer.

7. A block alterable memory cell, comprising:
   a substrate layer including an active region having a source doped region, a buried doped region essentially contiguous with said source doped region, a tunnel window region overlaying said buried doped region, and a drain doped region, spaced apart from the doped region all in the active region;
   a tunnel oxide layer overlaying the tunnel window and at least a portion of said buried doped region;
   a floating gate oxide layer overlaying said tunnel window region;
   a floating gate layer overlaying said tunnel oxide layer and said floating gate oxide layer;
   an interpoly layer having a first region overlaying said floating gate layer, said interpoly layer having a second region extending continuously from the first region overlaying an edge of said source doped region to an edge of said drain doped region; and
   a control gate layer extending continuously over said interpoly layer, said control gate layer extending from an edge of said source doped region to an edge of said drain doped region,
   whereby the control gate controls a first transistor having said floating gate and simultaneously controls a second adjacent select transistor having said source and drain.

8. The block alterable memory cell of claim 7, wherein said substrate layer is a p-type doped substrate.

9. The block alterable memory cell of claim 7, wherein said source doped region, said drain doped region, and said buried doped region have n-type dopants.

10. The block alterable memory cell of claim 7, wherein said floating gate layer and said second layer are polysilicon.

11. The block alterable memory cell of claim 7, wherein said interpoly layer is a nitride layer.

12. The block alterable memory cell of claim 7, wherein said interpoly layer is an ONO layer.

13. An abutting pair of block alterable memory cells, each memory cell comprising:
   a substrate layer including an active region having a source implant region, a buried implant region essentially contiguous with said source implant region, a tunnel window region overlaying said buried implant region, and a drain implant region spaced apart from the buried implant, all in the active region;
   a tunnel oxide layer overlaying the tunnel window and a portion of said buried implant region;
   a floating gate oxide layer overlaying said tunnel window region;
   a floating gate layer overlaying said tunnel oxide layer and said floating gate oxide layer;
   an interpoly layer having a first region overlaying said floating gate layer, said interpoly layer having a second region extending continuously from the first region and overlaying an edge of said source implant region to an edge of said drain implant region; and
   a control gate layer extending continuously over said interpoly layer, said control gate layer extending from an edge of said source implant region to an edge of said drain implant region,
   whereby the control gate controls a first transistor having said floating gate and simultaneously controls a second adjacent select transistor having said source and drain.

14. The abutting pair of block alterable memory cells of claim 13, wherein each of said pair of abutting block alterable memory cells shares the same buried implant region.

15. An abutting pair of block alterable memory cells, each memory cell comprising:
   a substrate layer including an active region having a source doped region, a buried doped region essentially contiguous with said source doped region, a tunnel window region overlaying said buried doped region, and a drain doped region spaced apart from the buried implant, all in the active region;
   a tunnel oxide layer overlaying the tunnel window and a portion of said buried doped region;
   a floating gate oxide layer overlaying said tunnel window region;
   a floating gate layer overlaying said tunnel oxide layer and said floating gate oxide layer;
   an interpoly layer having a first region overlaying said floating gate layer, said interpoly layer having a second region extending continuously from the first region and overlaying an edge of said source doped region to an edge of said drain doped region; and
   a control gate layer extending continuously over said interpoly layer, said control gate layer extending from an edge of said source doped region to an edge of said drain doped region, whereby the control gate controls a first transistor having said floating gate and simultaneously controls a second adjacent select transistor having said source and drain.

16. The abutting pair of block alterable memory cells of claim 15, wherein each of said pair of abutting block alterable memory cells shares the same buried doped region.

17. A block alterable pair of electrically erasable mirrored cells of a memory array of the type wherein each electrically erasable cell has a word line, a bit line and a select line, the word line and bit line determining the cell address, the select line determining a block operation for a multiplicity of cells, comprising:

a substrate having an active area defined by isolation at the periphery of the cell and having a buried implant in a central region of the active area, a mirrored pair of source implants proximate to the buried implant and a mirrored pair of drain implants at peripheral regions of the active area, a mirrored pair of floating gates of the type having a tunnel window allowing electrical charge communication with the buried implant through tunnel oxide spaced over the buried implant, the pair of floating gates both having portions overlaying the buried implant, the buried implant being common to both floating gates, a mirrored pair of control gates each having a first portion in spaced relation above the floating gates and a second portion continuous with the first portion insulatively spaced above the substrate between the sources and drains, whereby each source acts as a select line, each drain acts as a bit line and each control gate acts as a word line for each memory cell.

* * * * *

UNITED STATES PATENT AND TRADEMARK OFFICE
CERTIFICATE OF CORRECTION

| | |
|---|---|
| PATENT NO. | : 6,933,557 B2 |
| APPLICATION NO. | : 10/639073 |
| DATED | : August 23, 2005 |
| INVENTOR(S) | : Bohumil Lojek |

It is certified that error appears in the above-identified patent and that said Letters Patent is hereby corrected as shown below:

Column 4, line 39, insert new paragraph:

With reference to Fig. 3B, the appropriate voltages for reading, erasing, and programming the blocks of the memory array 300 are managed by a memory subsystem 330. As is known to a skilled artisan, a memory controller 340 receives memory subsystem instructions and/or control signals for programming, reading, or erasing blocks or bits of a memory device such as the memory array 300. Additionally, an input/output port 350 (I/O port) receives addresses and provides appropriate voltage levels for word line, bit line, and input/output data line selection in support of memory access operations. The I/O port 350 also provides connections for communicating data with the remainder of the system 360. By selecting word lines, bit lines, and source lines and applying appropriate voltages, the controller 340 and I/O port 350 will produce reading, erasing, and programming operations.

Column 4, line 52 through Column 5, line 13, replace paragraphs with the following paragraphs:

With reference to Fig. 4B, a cross sectional view 400 of the memory cell 310 is illustrated. The memory cell 400 is formed on a semiconductor substrate (or well) 401 of a first conductivity type, which in the exemplary embodiment is p-type. A drain implant region 402 and a source implant region 406 are implanted within an uppermost surface of the substrate 401. A buried, heavily doped implant 404 within a portion of the floating gate region is formed essentially contiguous with the source implant region 406 within the uppermost surface of the substrate 401. The implant regions 402, 404, and 406 are of a second conductivity type of a polarity opposite that of the conductivity type of the substrate 401. In a specific exemplary embodiment, the implants are n-type. The buried implant 404 is of n+ conductivity and serves as a tunneling charge source for a floating gate of the memory transistor 400. The drain implant region 402 and the buried implant 404 are spaced apart, so as to define an active region 414 in a portion of the space therebetween. Accordingly, the drain implant region 402 connects to the bitline $BL_i$. The source implant region 406 connects to the source line $S_i$.

UNITED STATES PATENT AND TRADEMARK OFFICE
CERTIFICATE OF CORRECTION

PATENT NO. : 6,933,557 B2
APPLICATION NO. : 10/639073
DATED : August 23, 2005
INVENTOR(S) : Bohumil Lojek It is certified that error appears in the above-identified patent and that said Letters Patent is hereby corrected as shown below:

A first poly layer 410, forming the floating gate of the memory transistor 304, overlays the buried implant region 404, separated therefrom by a gate ONO layer 450. A second poly layer 408, forming a common control gate, extends continuously over the first poly layer 410 (which forms the floating gate) from the source dopant region 406 to the drain dopant region 402, overlaying both the buried implant 404 and the select transistor 302 active region 41 4. An interpoly layer 412 separates the first poly layer 410 from the second poly layer 408. The interpoly layer 412 also extends over the active region 414 and isolates the second poly layer 408 from the semiconductor substrate. The interpoly layer 412 extends continuously over the first poly layer 410 from the source dopant region 406 to the drain dopant region 402. The interpoly layer 412 may be of ONO type material. A tunnel oxide 460 of thickness 50-70 angstroms is formed in a tunnerl window region between the buried implant 404 and the floating gate 410.

Signed and Sealed this

Ninth Day of January, 2007

JON W. DUDAS
*Director of the United States Patent and Trademark Office*